United States Patent
Li et al.

(10) Patent No.: US 7,642,202 B1
(45) Date of Patent: Jan. 5, 2010

(54) METHODS OF FORMING MOISTURE BARRIER FOR LOW K FILM INTEGRATION WITH ANTI-REFLECTIVE LAYERS

(75) Inventors: Ming Li, West Linn, OR (US); Bart Van Schravendijk, Sunnyvale, CA (US); Tom Mountsier, San Jose, CA (US); Chiu Chi, San Jose, CA (US); Kevin Ilcisin, Beaverton, OR (US); Julian Hsieh, Pleasanton, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/168,013

(22) Filed: Jun. 27, 2005

Related U.S. Application Data (63) Continuation-in-part of application No. 10/773,821, filed on Feb. 5, 2004, now Pat. No. 7,052,988, which is a continuation of application No. 09/990,197, filed on Nov. 21, 2001, now Pat. No. 6,720,251.

(60) Provisional application No. 60/302,112, filed on Jun. 28, 2001.

(51) Int. Cl.
*H01L 21/31* (2006.01)
*H01L 21/469* (2006.01)

(52) U.S. Cl. .................. 438/786; 438/624; 438/783; 257/E21.627; 257/E21.277

(58) Field of Classification Search .................. 438/584, 438/400, 618, 622, 624, 778, 783, 784, 786, 438/FOR. 395; 257/E21.227, E21.627
See application file for complete search history.

(56) References Cited

U.S. PATENT DOCUMENTS

| | | | |
|---|---|---|---|
| 4,901,133 A | * | 2/1990 | Curran et al. ............... 257/637 |
| 5,246,734 A | * | 9/1993 | Varaprath et al. ......... 427/163.2 |
| 5,481,135 A | * | 1/1996 | Chandra et al. ............. 257/701 |
| 5,530,581 A | * | 6/1996 | Cogan ......................... 359/265 |
| 6,051,282 A | | 4/2000 | Konjuh et al. |
| 6,147,009 A | | 11/2000 | Grill et al. |
| 6,156,640 A | | 12/2000 | Tsai et al. |
| 6,168,726 B1 | | 1/2001 | Li et al. |
| 6,174,816 B1 | | 1/2001 | Yin et al. |
| 6,214,526 B1 | | 4/2001 | Sundararajan et al. |
| 6,235,456 B1 | | 5/2001 | Ibok |
| 6,242,361 B1 | | 6/2001 | Lee et al. |

(Continued)

OTHER PUBLICATIONS

U.S. Office Action mailed Feb. 16, 2005, from U.S. Appl. No. 10/773,821.

(Continued)

*Primary Examiner*—Matthew Smith
*Assistant Examiner*—Quovaunda Jefferson
(74) *Attorney, Agent, or Firm*—Weaver Austin Villeneuve & Sampson LLP (57) ABSTRACT

A nitrogen-free anti-reflective layer for use in semiconductor photolithography is fabricated in a chemical vapor deposition process, optionally plasma-enhanced, using a gaseous mixture of carbon, silicon, and oxygen sources. By varying the process parameters, a substantially hermetic layer with acceptable values of the refractive index n and extinction coefficient k can be obtained. The nitrogen-free moisture barrier anti-reflective layer produced by this technique improves plasma etch of features such as vias in subsequent processing steps.

21 Claims, 6 Drawing Sheets

U.S. PATENT DOCUMENTS

| | | | |
|---|---|---|---|
| 6,245,690 B1 * | 6/2001 | Yau et al. | 438/780 |
| 6,251,770 B1 | 6/2001 | Uglow et al. | |
| 6,316,167 B1 * | 11/2001 | Angelopoulos et al. | 430/313 |
| 6,340,628 B1 * | 1/2002 | Van Cleemput et al. | 438/586 |
| 6,376,392 B1 | 4/2002 | Lee et al. | |
| 6,472,333 B2 * | 10/2002 | Xia et al. | 438/758 |
| 6,635,583 B2 * | 10/2003 | Bencher et al. | 438/761 |
| 6,720,251 B1 | 4/2004 | van Schravendijk et al. | |
| 7,335,980 B2 * | 2/2008 | Nguyen et al. | 257/701 |
| 2001/0004550 A1 * | 6/2001 | Passemard | 438/618 |
| 2002/0155386 A1 | 10/2002 | Xu et al. | |
| 2005/0282404 A1 * | 12/2005 | Nguyen et al. | 438/788 |

OTHER PUBLICATIONS

U.S. Office Action mailed Jun. 14, 2005, from U.S. Appl. No. 10/773,821.

van Schravendijk et al., "Applications and Methods of Making Nitrogen-Free Anti-Reflective Layers for Semiconductor Processing", Novellus Systems, Inc., U.S. Appl. No. 10/773,821, filed Feb. 5, 2004, pp. 1-18.

U.S. Office Action mailed Oct. 24, 2002, from U.S. Appl. No. 09/990,197.

U.S. Office Action mailed May 21, 2003, from U.S. Appl. No. 09/990,197.

U.S. Appl. No. 11/710,377, filed Feb. 22, 2007.

U.S. Appl. No. 11/418,837, filed May 5, 2006.

U.S. Appl. No. 11/487,155, filed Jul. 13, 2006.

* cited by examiner

METHODS OF FORMING MOISTURE BARRIER FOR LOW K FILM INTEGRATION WITH ANTI-REFLECTIVE LAYERS

CROSS-REFERENCE TO RELATED PATENT APPLICATIONS

This application is a continuation-in-part of and claims priority to U.S. patent application Ser. No. 10/773,821, filed Feb. 5, 2004, now U.S. Pat. No. 7,052,988 which is a continuation of and claims priority to U.S. patent application Ser. No. 09/990,197, filed Nov. 11, 2001, now U.S. Pat. No. 6,720,251, which claims priority to U.S. Provisional Patent Application 60/302,112, filed Jun. 28, 2001. These applications are incorporated by reference in their entireties.

FIELD OF THE INVENTION

This invention relates to the manufacture of semiconductor devices as components of integrated circuits, specifically to processes for photolithography in which anti-reflective coatings are used to increase the efficiency and accuracy of the photolithographic processing steps.

BACKGROUND OF THE INVENTION

In a dual damascene architecture, wiring patterns are etched into a dielectric, or insulating layer. See, e.g., Handbook of semiconductor interconnection technology, edited by Schwartz et al., Marcel Dekker 1998; and Copper-Fundamental Mechanisms for Microelectronic Applications, Murarka et al., Wiley 2000. The conductor material (typically copper) is then inlaid into those features. There are two types of features used for this purpose: trenches, which form the actual wiring template; and vias, which make connection to the metal level below. Creating such structures requires two passes through the photo-lithography process. Either the vias are formed first and then the trenches or vice versa.

The dielectric stack requirements for dual damascene include the primary insulating layer and a thin copper diffusion barrier or selective metal barrier. Additional layers may be included to facilitate fabrication, such as an intermediate etch stop, hard mask, etc.

Figure 1:
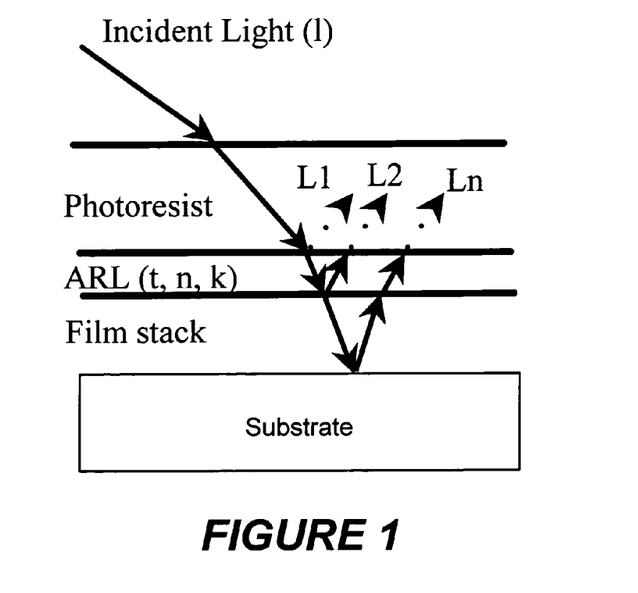
FIG. 1 is a schematic drawing illustrating how an ARL works. By adjusting the thickness, refractive index and extinction coefficient (t, n, k) of the ARL, destructive interference between the incident light and all of the reflective lights L1, L2, . . . Ln can be obtained within the photoresist. Preferably, with the appropriate conditions, a zero reflectivity can be reached in the photoresist.

An anti-reflective layer (or ARL) is often used for photolithographic processes. The ARL minimizes the total reflection of light from layers under the photoresist and the interface between the photoresist layer and the underlying layer. By adjusting the thickness, t, refractive index, n, and extinction coefficient, k, of the ARL film, as shown in FIG. 1, a destructive interference can be obtained in the photoresist with equivalent intensities of incident and reflective light. As a result, zero reflectivity can be reached under ideal conditions. Thus, an ARL improves the accuracy of pattern transfer when the photoresist is developed.

Figure 2:
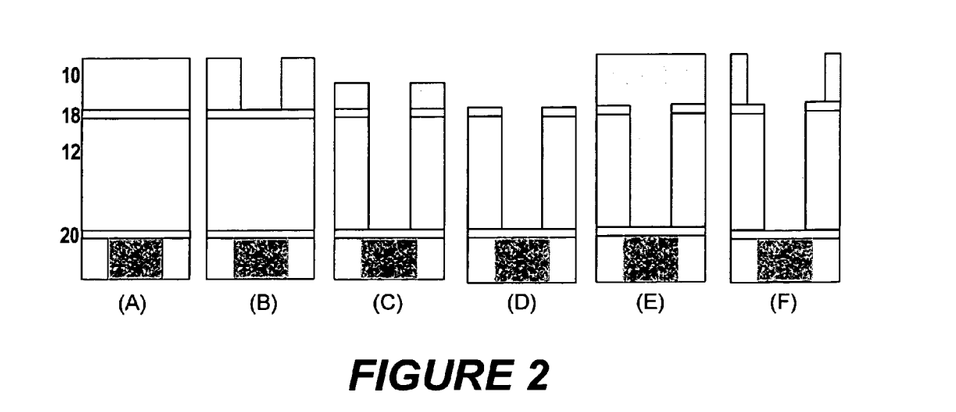
FIG. 2 shows a simplified lithography process flow of the via-first dual damascene applications. The process includes (a) via photoresist coating; (b) via photoresist development; (c) via etch; (d) via photoresist ash and cleaning; (e) trench photoresist coating; and (f) trench photoresist development.

FIG. 2 shows a schematic diagram of a simplified lithography process flow of a via-first dual damascene process. Typically, anti-reflective layer 18 is deposited onto underlying layer 12, which is being patterned over a film stack. Underlying layer 12 is generally dielectric material deposited on a barrier layer 20. Photoresist 10 is then spun onto the top of the anti-reflective layer. See, FIG. 2 (a). The process proceeds through (b) via photoresist development to (c) via etch to the barrier layer 20 to (d) via photoresist removal and cleaning to (e) trench photoresist coating and (f) trench photoresist development. The exposed portion of the photoresist layer 10 is removed when photoresist layer 10 is developed, yielding the clean vertical walls shown in FIG. 2(b) when UV radiation is incident on area of the top surface of photoresist layer 10, exposing a portion of the photoresist layer 10. When developed, the trench should be patterned properly and yield a vertical wall, as shown in FIG. 2(f).

However, this identity in pattern after the development step is not always realized. More specifically, silicon dioxide ($SiO_2$) historically has been used as the primary interconnect insulating layer. With device geometries shrinking and speeds increasing, the trend now is towards insulating materials with lower dielectric constants (low-k).

Substantially nitrogen-free (NF) ARLs have been developed to eliminate footing and inhibit the photoresist poisoning in damascene applications. The NF ARLs are compatible with chemically amplified photoresists found in lithography processes using DUV radiation and may be used with any wavelength of UV radiation.

However, current methods of processing wafers as described above may permit moisture to penetrate into the low-k dielectric. Moisture from the atmosphere and overlying layers may penetrate the low-k film during subsequent processing steps. The less dense low-k film, particularly the ultra low-k film, may absorb and keep the moisture easily in the film. The moisture then releases from the opened via during the etch process. Moisture release significantly effects plasma etch rate, especially in isolated vias. Moisture release may result in the via etch shown in FIG. 2(c) slowed down and not reaching the barrier layer 20 in the desired etch duration.

There is a need for improved methods of plasma etching of dual damascene features in low-k dielectric materials. It would be desirable to provide layers on the low-k dielectrics that have anti-reflective properties and limit the effect of moisture release on plasma etch.

SUMMARY OF THE INVENTION

The present invention meets these needs by providing a moisture barrier film in an anti-reflective layer film stack on a low-k dielectric. The invention also provides methods of forming anti-reflective moisture barrier layers. In some embodiments, a single layer of film may act as anti-reflective film as well as moisture barrier film. In other embodiments, a multi-layer film stack is provided. The moisture barrier film in the film stack is substantially hermetic to prevent moisture from entering the low-k film.

The moisture barrier film-anti-reflective layer (MBF-ARL) can be formed using chemical vapor deposition (CVD), including, for example, plasma enhanced chemical vapor deposition (PECVD), low-pressure chemical vapor deposition, (LP-CVD), high-density plasma chemical vapor deposition (HDP-CVD), or similar methods under process conditions that are designed to provide an ARL having the desired properties. These properties include hermeticity, as well as anti-reflective-related properties including appropriate thickness (t), refractive index (n), and extinction coefficient (k), with the values of n and k being a function of the wavelength of the radiation.

The MBF-ARL is formed by introducing source gases or liquids comprising silicon, oxygen, carbon, and hydrogen into the reaction chamber of the CVD unit. In a preferred embodiment, the MBF-ARL is formed from carbon dioxide and silane. In a particularly preferred embodiment, helium is introduced with the process gas. The process conditions or parameters giving rise to an effective moisture barrier with anti-reflective properties include the flow rate of the reactant gases, the volumetric ratio of the gaseous components, the deposition pressure, the deposition temperature, and the rate at which radio frequency (RF) power is applied in a PECVD unit (per unit area of the surface of the wafer or other substrate on which the ARL is formed). In a particularly preferred embodiment, a dual power RF source with a low-frequency (LF) power source of at least 0.12 W/cm$^2$ is used.

BRIEF DESCRIPTION OF THE DRAWINGS

This invention will be better understood by reference to the following drawings and description, in which the same reference numerals are used to identify like components.

DESCRIPTION OF THE PREFERRED EMBODIMENT

The present invention provides a moisture barrier film (MBF) integrated with an anti-reflective layer (ARL) for use in semiconductor photolithography. The MBF-ARL film can be fabricated in a chemical vapor deposition process, optionally plasma-enhanced, using a mixture of carbon, silicon, oxygen, and hydrogen sources. By varying the process parameters, hermeticity as well as acceptable values of the refractive index n and extinction coefficient k can be obtained. The anti-reflective layer including moisture barrier film produced by this technique significantly reduces or eliminates the inhibitory effect of moisture on plasma etch rate, as eliminates footing and inhibits the photoresist poisoning of conventional ARLs.

It will be apparent to one skilled in the art, that the present invention may be practiced without some or all of these specific details. In other instances, well known process operations have not been described in detail in order not to unnecessarily obscure the present invention.

Moisture penetration of the dielectric material is undesirable for several reasons. First, water in the dielectric material increases the k-value of the dielectric material. In addition some of moisture absorbed into dielectric film will release during the plasma etch of the dielectric. This moisture release slows down the plasma etch rate. Moisture release is a particular problem for isolated features.

Figure 3:
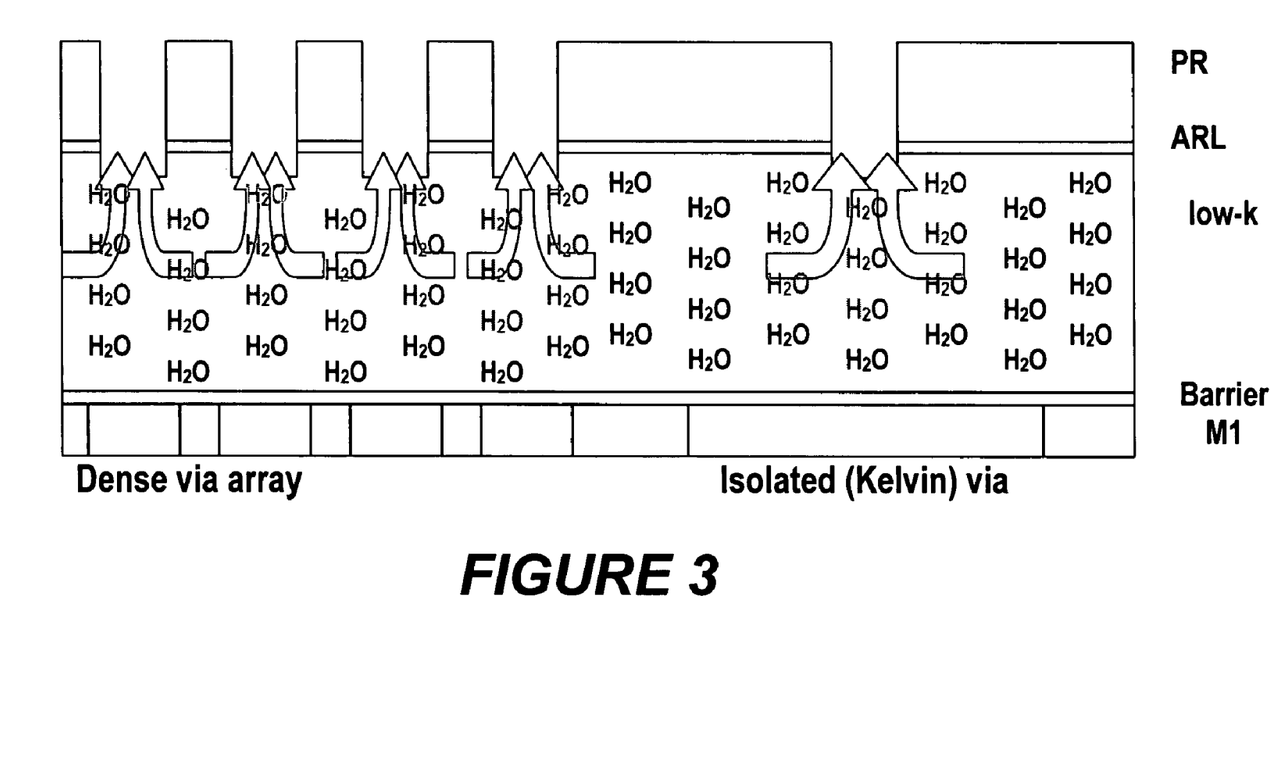
FIG. 3 is a schematic diagram showing moisture penetration in dense via arrays and isolated vias in a low-k film.

FIG. 3 is a schematic diagram showing moisture penetration into low-k film and moisture release during an etch of a dense array of vias and an isolated via. During plasma etch (e.g. as shown in FIG. 2(c)), the via is etched through photoresist (PR) layer, the anti-reflective layer (ARL) and the low-k dielectric material to the barrier layer. M1 denotes the metal layer. The moisture in the low-k film penetrates the dielectric material before the ARL is deposited, or during subsequent processing steps. The arrows in FIG. 3 indicate moisture releasing into the vias. As can be seen in the diagram, the density of moisture released into the isolated via is higher than that released into a via in the dense array. This is due to the smaller number of open areas available for moisture to release per unit area of dielectric. Because more moisture per area is released into an isolated feature, the retarding impact that moisture release has on the plasma etch rate is especially pronounced for isolated features. This gives rise to non-uniform etch rates across the wafer surface.

Figure 4:
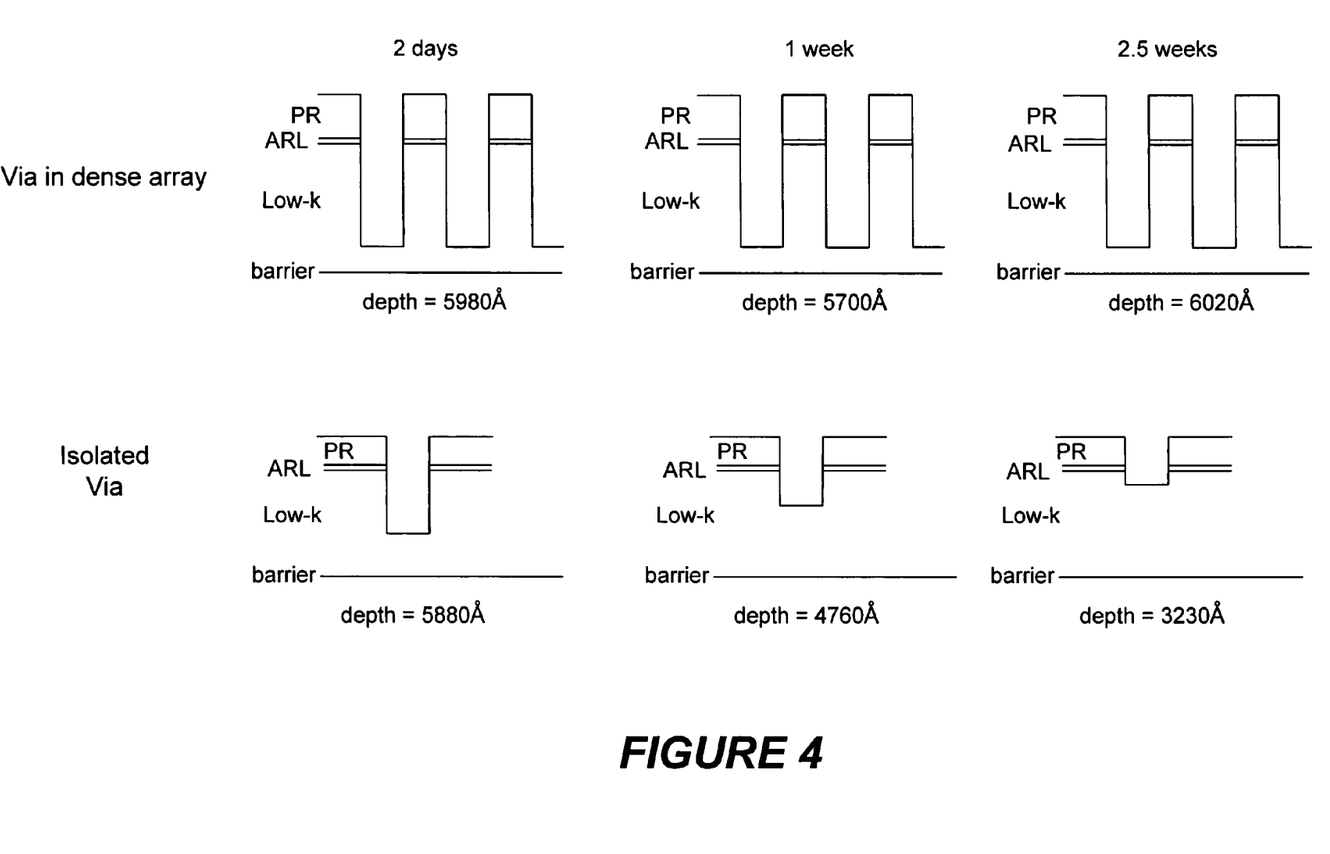
FIG. 4 shows rough schematic diagrams of dense via arrays and isolated vias etched after 2 days, 1 week and 2.5 weeks of exposure to the atmosphere.

This is evident in FIG. 4, which shows rough schematic diagrams of dense via arrays and isolated vias etched after 2 days, 1 week and 2.5 weeks of exposure to the atmosphere. The longer the exposure to the atmosphere, the more moisture is absorbed into the via and released during etch. Thus, if the plasma etch rate of a particular feature is affected by moisture release, the decrease in etch rate (and via depth for a particular etch time) will correlate to exposure time. As shown in FIG. 4, the depths of the via etched in the dense array were fairly uniform −5980 Å after 2 days, 5700 Å after 1 week and 6020 Å after 2 weeks. Depth did not decrease with exposure time, indicating that the moisture release does not contribute significantly to the etch rate of vias in a dense array. However, isolated via depth decreased significantly with exposure time with a via of 5880 Å etched after 2 days, 4760 Å after 1 week and 3230 Å after 2 weeks. While 2 weeks of exposure resulted in an almost one hundred percent reduction in the depth of the plasma etch. This indicates that moisture release significantly slows the plasma etch rate of isolated vias.

The anti-reflective films of the present invention provide a hermetic seal to block moisture from penetrating the low-k dielectric material prior to plasma etch. According to various embodiments, in addition to being hermetic, the MBF-ARL films of the present invention possess the following optical properties: the nitrogen-free ARL has an extinction coefficient ("k") of from about 0 to about 1.3 at 248 nm, and more preferably, of about 0.1 to about 1.1; and a refractive index ("n") of about 1.5 to about 3.0 and more preferably, of about 1.6 to about 2.2. (When the wavelength decreases, e.g., to 193 nm and beyond, the corresponding refractive index of a nitrogen-free ARL film will decrease and the extinction coefficient will increase.) The ARL will have a thickness of between about 300 and 5000 Angstroms.

The NF MBF-ARL films of the invention are also thermally and optically stable to the conditions typically used in semiconductor manufacturing; thus, the parameters of n, k, and t will not vary significantly throughout the semiconductor manufacturing process. The present invention can be used to be produced MBF-ARLs for use with radiation having a wavelength within the UV range, including wavelengths of 365 nm, 248 nm, 193 nm and beyond.

The NF MBF-ARL films of the invention are hermetic. Hermeticity may be measured by the decrease in stress of a tensile TEOS film caused by exposure to the atmosphere. Without a hermetic barrier layer, the stress of a tensile TEOS film will decrease dramatically during exposure to the atmosphere. For example, the stress of a tensile 5 kÅ TEOS film decrease from $10^9$ dynes/cm$^2$ to $-10^9$ dynes/cm$^2$ after approximately one week of exposure to the atmosphere—a decrease of over 100%. Capping the tensile TEOS films with a hermetic film results in a stress change in a tensile TEOS of less than 10% after one week of exposure time.

Hermetic films may be produced by increasing the film density, improving the bonds within the film, increasing the number of short bonds and reducing the number of dangling bonds (i.e. bonds which leave unpaired electrons). Increased film density, increased number of short bonds, increased cross-linking and reduced number of dangling bonds helps prevent moisture from penetrating the film.

In one embodiment, the nitrogen-free MBF-ARL is produced from silicon, oxygen, hydrogen, and carbon containing source gases or liquids, optionally with one or more inert gases, in a CVD system. In a preferred embodiment, a helium flow is also introduced during deposition of the MBF-ARL.

Preferred sources of silicon include silane, organosilicate compounds, for example, tetraethylorthosilicate (TEOS) or tetramethylorthosilicate (TMOS), or an organosilane, such as, tetramethylsilane or a phenylsilane. Fluorinated reactants such as silicon tetrafluoride may be used although fluorine is generally a less desirable film component. Organic groups on the organosilicate or organosilane precursors can be aromatic or aliphatic. Alternatively, mixtures of the aforementioned compounds, or mixed compounds, in which some organic substituents are bonded to silicon through an oxygen linkage and others are attached directly to silicon, such as alkylalkoxysilanes, are used as silicon precursors. In many embodiments, all reactants will be nitrogen-free, i.e., they will contain no nitrogen moieties such as amines.

Suitable oxygen containing source gases and liquids include any source gas that contains oxygen and does not contain nitrogen. For example, suitable sources of oxygen include carbon dioxide, carbon monoxide, methanol, water, and the like. Elemental oxygen gas (usually in pure form) can also be used if TEOS is used as the silicon source.

The silicon and/or the oxygen source can also provide a source of carbon. Alternatively, a separate carbon source, such as methane, can be used in producing the ARL. Again, virtually any carbon source can be used provided that it does not contain nitrogen.

Generally, the silicon, oxygen, and/or the carbon source will also serve as a source of hydrogen. Alternatively, a separate hydrogen source, such as hydrogen gas, may be used in producing the ARL.

According to some embodiment, a non-reactive carrier gas is also used during deposition. Suitable inert gases include the Noble gases, such as neon, helium and argon.

ARL film composition and properties can be varied by modifying the gas flow rate, deposition pressure, deposition temperature, and RF power level. Generally, however, increasing oxygen content in the film will result in a more transparent ARL whereas increasing carbon and/or silicon content will produce a less transparent ARL.

In some embodiments of the present invention, the MBF-ARL film is a single layer film. The single layer MBF ARL film has dual functionality in that it is hermetic and provides the desired optical properties.

Atomic concentrations of a representative nitrogen-free MBF-ARL of the present invention are: 2 to 20% hydrogen; 30 to 70% silicon; and 20 to 80% oxygen. For convenience the amounts of each ingredient are stated as round numbers. However, one skilled in the art will recognize that amounts within 10 or 20 percent of the stated values can also be expected to be appropriate, i.e., where 20% is stated, a range of from 16-18% to 22-24% is implicit and can be appropriate.

Methods of producing NF ARL films with the desired optical properties are described in U.S. Pat. No. 6,720,251 which is incorporated by reference in its entirety. According to various embodiments, the methods of the present invention produce hermetic NF ARL films by increasing the film density, improving bond strength and increasing the number of short bonds in the film and reducing the number of dangling bonds of the NF ARL films described in U.S. Pat. No. 6,720,251. Dangling bonds occur where atoms are not bound to the proper number of neighboring atoms. For example, dangling bonds occur where silicon, which is tetrahedrally coordinated, does not bond to four neighboring atoms. Producing a hermetic ARL film involves, in some embodiments, adding an inert carrier gas, such as helium, to the process gas and/or using a dual frequency PECVD system with both high and low frequency radio frequency power sources, wherein the low frequency radio frequency power can be applied at a rate of at least $0.12$ $W/cm^2$. The high and low frequency sources are powered concurrently during the deposition process.

The first step in the formation of an MBF-ARL of the invention is to place a substrate, typically a silicon wafer, on a pedestal in a CVD reactor. The total gas pressure in the CVD reactor chamber is typically between 0.1 mTorr and 100 Torr and is dependent on the type of deposition (e.g., PECVD or HDP-CVD), and more preferably, at about 2-5 Torr for PECVD depositions. The substrate temperature is typically in the range from about 200° C. to 500° C. or even upwards of 900° C. for front-end processes. While maintaining the substrate temperature and the reactor pressure below 100 Torr, process gas is introduced into the reactor. The process gas reacts on the surface of the substrate thereby depositing the anti-reflective layer.

For single layer MBF-ARL embodiments, generally, the process gas is a gas mixture comprising silicon, oxygen, hydrogen, and/or carbon containing gases. In a preferred embodiment using silane and carbon dioxide as the source gases, the ratio of carbon dioxide to silane will typically be between about 5:1 and 100:1, and more preferably from about 25:1 to 75:1. In preferred embodiments, the process gas will also contain an inert gas. A preferred inert gas is helium. The ratio of helium to carbon dioxide may range from 0.2:1 to 5:1 and is preferably 1.5:1 to 2.5:1.

Flow rates of the gases will vary according to the reactant and film properties desired. More specifically, carbon dioxide can be introduced at a rate of from 2.5 $sccm/cm^2$ to 25 $sccm/cm^2$, preferably about 5 $sccm/cm^2$; and silane, at a rate of from about 0.01 $sccm/cm^2$ to about 0.5 $sccm/cm^2$, preferably about 0.06 to about 0.25 $sccm/cm^2$. Helium may be introduced at a rate of about 2.5 $sccm/cm^2$ to 25 $sccm/cm^2$. The ratio of helium to carbon dioxide may range from 0.2:1 to 5:1 and is preferably 1.5:1 to 2.5:1. All flow rates given above are based on per square centimeter of the wafer surface area.

Without being bound by a particular theory, it is believed that the presence of helium in the process gas improves the bombardment on the film deposition and makes the film denser, as a result, the film hermeticity is enhanced. Bonding structures of the ARL film are improved and the number of dangling bonds is reduced.

The CVD process may be plasma enhanced. The process gas is ionized to enhance the deposition of the ARL, for example to increase the deposition rate. In plasma enhanced CVD, a radio frequency power is applied to sustain a plasma discharge for depositing a nitrogen-free ARL with desired properties and will vary depending on total flow. The radio frequency power is applied at a rate of from 0.05 $W/cm^2$ to 3.5 $W/cm^2$, preferably about 0.15 to 0.30 $W/cm^2$.

In a preferred embodiment, a dual frequency PECVD system with both high and low frequency radio frequency power supplies can be used. As is well known in the art, in general, high frequency components of the RF power delivered to a reactor control the plasma density and low frequency components produce ion bombardment of the film. The high and low frequency components can be provided at any of a number of suitable frequencies. In a typical process, the Low Frequency LF component is provided in a frequency range of about 100 to 600 kHz, more preferably about 200-500 kHz, for example about 300 kHz. The High Frequency HF component is generally between 2-60 MHz—in one process example, an HF frequency of 13.56 MHz is used.

It has been found that using a dual power source with a LF source power of at least 0.12 W/cm$^2$ results may be used to create the hermetic MBF-ARL films of the present invention. Increased ion bombardment results in increased film density. It is believed that the increased film density and improved bonding in the film aids in preventing moisture from penetrating the film. In preferred embodiments, the LF source power is between 0.1 W/cm$^2$ and 1.0 W/cm$^2$, and in particularly preferred embodiments between 0.15 W/cm$^2$ and 0.7 W/cm$^2$. The high frequency source power is typically between 0.1 W/cm$^2$ and 0.6 W/cm$^2$. A preferred ratio of LF to HF power is between 0.2 to 0.4.

In some embodiments of the present invention, the MBF-ARL film is a multi-layer film. One or more layers provide the hermetic properties and the other layers provide the desired optical properties. In a preferred embodiment, the multi-layer MBF-ARL film has two layers—one which provides the moisture barrier or hermetic properties and one which provides anti-reflective properties.

For embodiments, in which a multi-layer MBF-ARL film is used, the NF ARL films described above and in further detail in U.S. Pat. No. 6,720,251 may be used for the layer that functions an anti-reflective layer or layers. The MBF layer or layers may be produced as discussed above without regard to optical properties. Examples of materials that may be used the MBF layer in multi-layer film are hermetic films such as silicon nitride or other nitrogen free hermetic films. The MBF layer in a multi-layer film may also be produced as described above for the single layer MBF-ARL film; i.e. by introducing liquids or gases containing silicon, carbon, and/or oxygen with an inert gas and/or a in a dual RF power source with LF power of at least 0.12 W/cm$^2$.

Figure 5:
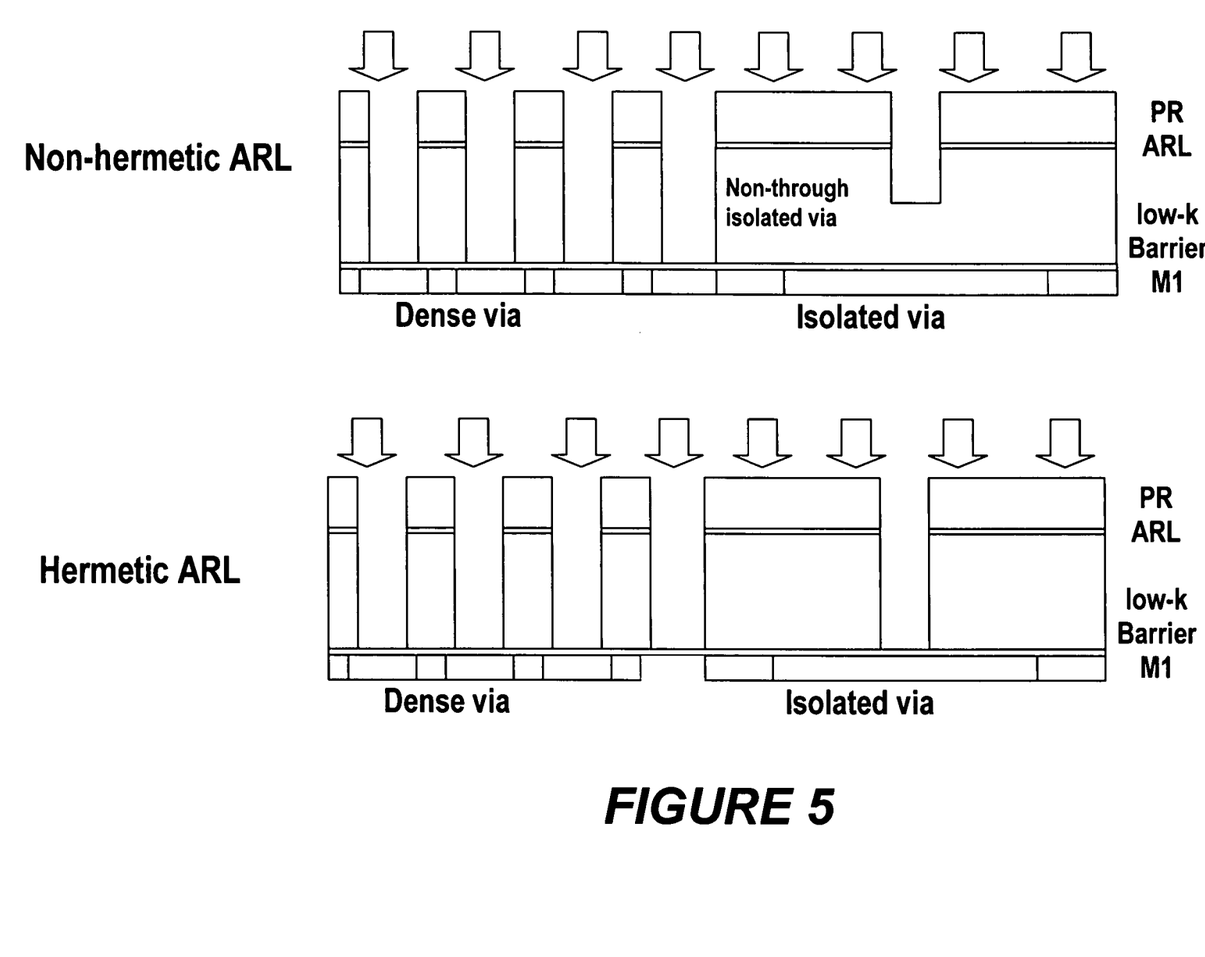
FIG. 5 is a schematic diagram comparing via etch of a film stack capped with a non-hermetic ARL with that of a stack capped with a hermetic ARL.

The MBF-ARLs produced by the methods of the invention improve plasma etch. FIG. 5 is a schematic diagram comparing via etch using a non-hermetic ARL with using a hermetic MBF-ARL. As shown in FIG. 5, plasma etch of the dense via arrays through to barrier layer is obtained using non-hermetic and hermetic ARLs. However, plasma etch of a isolated via using a non-hermetic ARL results in a non-through via. Using an MBF-ARL, however, resolves plasma etch problems and results in an isolated via etch that goes through to the barrier layer.

The methods of this invention are particularly useful in conjunction with a multiple-station CVD unit such as the Concept One, Concept One MAXUS™, Concept Two SEQUEL Express™, Concept Two Dual SEQUEL Express™, Concept Three SEQUEL™, and VECTOR™ System plasma-enhanced chemical vapor deposition (PECVD) units; or the Concept Two SPEED™, Concept Two SPEED/SEQUEL™, or Concept Three SPEED™ high-density plasma (HDP) CVD units, each of which is manufactured by Novellus Systems, Inc. of San Jose, Calif. In such multi-station units, the anti-reflective layer is preferably deposited as a series of sublayers each of which is formed at a different processing station, as described in the commonly assigned application Ser. No. 08/987,905, filed Dec. 9, 1997 now abandoned, which is incorporated herein by reference in its entirety.

The MBF-ARL film of the present invention may also be used in any application in which it is undesirable to have moisture penetration. Although dual damascene structures are discussed above, one of skill in the art would recognize that the MBF-ARL layer may also be used in single damascene process, particularly via formation. For example, the MBF-ARL of the present invention can also serve as a cap layer in single or dual damascene applications.

EXPERIMENTAL

Example 1

Stress as a function of exposure time was measured for hermetic NF ARL (i.e. a single layer NF MBF-ARL) and non-hermetic NF ARL capping a 5kÅ TEOS deposited on a bare silicon wafer. Results were compared to changes in stress of a non-hermetic reference film (TEOS only) and a hermetic reference film (SiN).

Process conditions for formation of the hermetic film on Novellus Vector were: 8500 sccm of $CO_2$, 500 sccm silane, 17000 sccm helium. The film was deposited by a PECVD process using a dual power source with HFRF power at 0.26 W/cm$^2$ and LFRF power at 0.18 W/cm$^2$ under pressure of about 4 Torr. The n is around 1.85 and k is about 0.85 at 193 nm wavelength.

Process conditions for formation of the non-hermetic film were: 14000 sccm of $CO_2$, 500 sccm silane. The film was deposited by a PECVD process using a dual power source with HFRF power at 0.3 W/cm$^2$ and LFRF power at 0.1 W/cm$^2$.

Figure 6A:
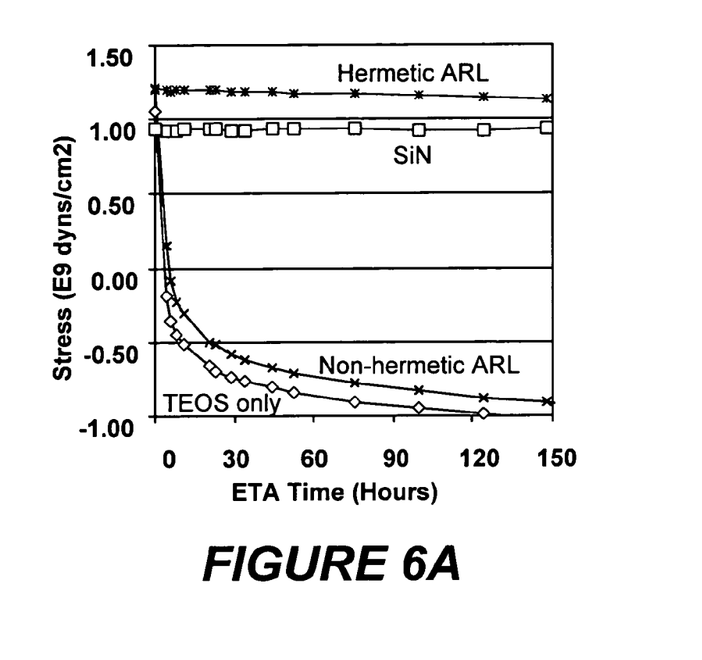
FIGS. 6a and 6b are graphs showing stress as a function of time of hermetic and non-hermetic film stacks.
Figure 6B:
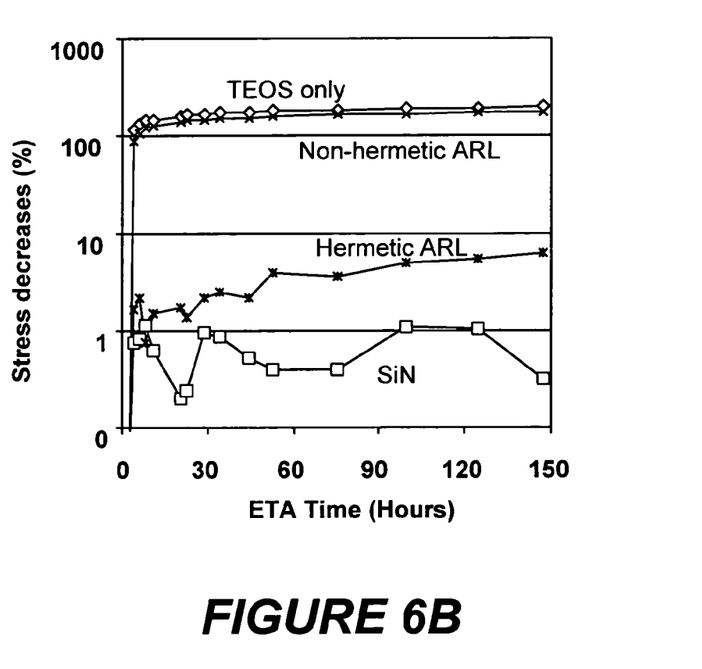

The films were exposed to the atmosphere for 7 days (168 hours) and the stress of each film was monitored. FIG. 6a shows stress as a function of time for the non-hermetic and hermetic ARL films, as well as the TEOS-only and SiN reference films. The stress of the hermetic ARL film and the reference SiN film stacks are fairly constant, indicating that these films are effective moisture barriers. By contrast, the stress of the non-hermetic ARL film stack decreases dramatically with exposure to air. The presence of the non-hermetic ARL cap film resulted in almost as much stress decrease as the TEOS only film. FIG. 6b shows the percent decrease in stress. Both the TEOS only non-hermetic reference film and the TEOS film capped by a non-hermetic ARL show over 100% decrease in stress, while capping the hermetic ARL film resulted in stress decrease of less than 10%—comparable to that of the SiN reference film.

FIGS. 6a and 6b show that the stress decrease is greatest in the first few hours of exposure to the atmosphere. This indicates that moisture penetration and its effects on etch rate may occur even for short periods of exposure to the atmosphere.

Figure 7:
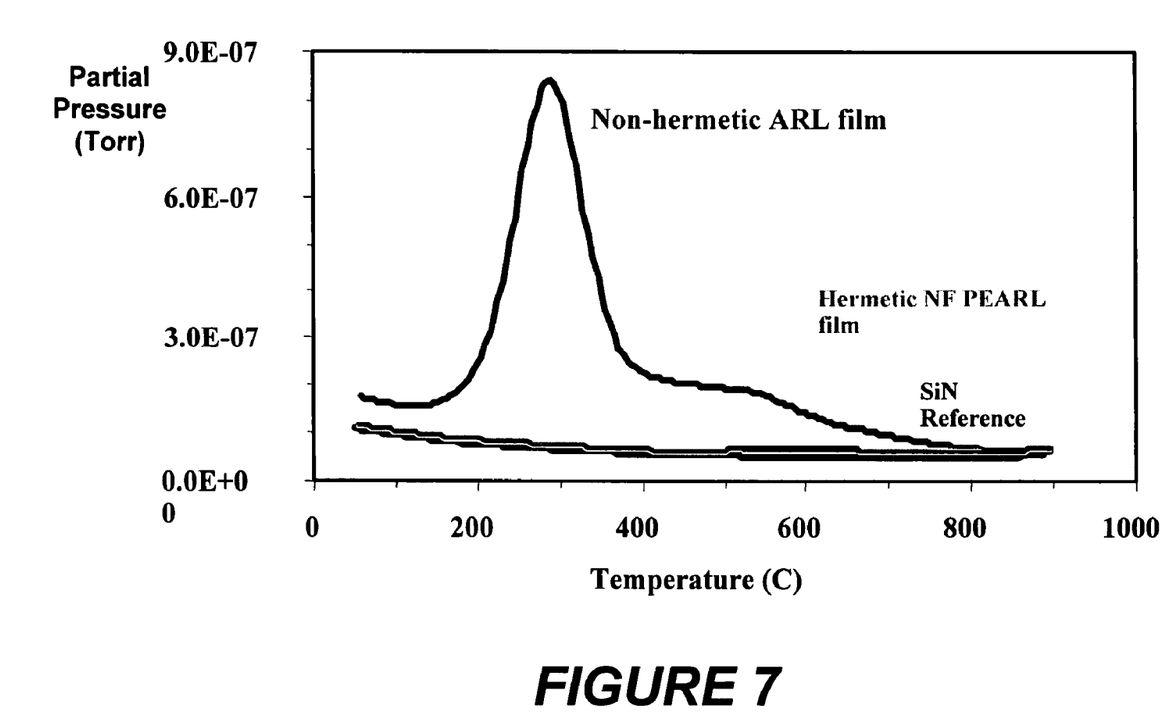
FIG. 7 is a graph showing gas released from hermetic and non-hermetic films after exposure to ambient conditions.

Tensile TEOS films on silicon substrates capped with a non-hermetic ARL film, a hermetic ARL film and a SiN reference film were exposed to ambient conditions for 12 days and then heated. The partial pressure of the moisture driven off was measured. The results are shown in FIG. 7, which shows that very little moisture penetrated the hermetic ARL film while a significant amount of moisture penetrated the non-hermetic ARL film. The non-hermetic and hermetic ARL films used to generate the data in FIG. 7 were formed by similar processes as described in FIGS. 6a and b.

Example 2

A hermetic ARL film was formed with process conditions on Novellus VECTOR™ were: 13500 sccm of $CO_2$, 300 sccm silane, 15000 sccm helium. The film was deposited by a PECVD process using a dual power source with HFRF power at 0.3 W/cm² and LFRF power at 0.18 W/cm². A hermetic film with an n about 1.8 and a k about 0.3 at 193 nm was formed.

It will be understood that the embodiments described above are merely illustrative of the broad principles of this invention, and not limiting. Many alternative and additional embodiments of this invention will be apparent to those skilled in the art.

What is claimed is:

1. A method of fabricating an anti-reflective layer of a dual damascene device in a chemical vapor deposition chamber, the method comprising the steps of:
   forming a first layer of dielectric that is to be patterned;
   forming by chemical vapor deposition an anti-reflective layer over the first layer, wherein the anti-reflective layer is a moisture barrier and/or is substantially hermetic and wherein the anti-reflective layer is nitrogen-free;
   wherein forming the anti-reflective layer comprises introducing a process gas mixture comprising carbon dioxide and helium to the chemical vapor deposition chamber, and wherein the ratio of the helium gas flow rate to the carbon dioxide gas flow rate is from about 1:1 to 5:1; and
   depositing a photoresist that contacts the anti-reflective layer.

2. The method of claim 1 wherein forming an anti-reflective layer comprises introducing gas or liquid sources of carbon, hydrogen, silicon, and oxygen.

3. The method of claim 2 wherein forming an anti-reflective layer comprises introducing an oxidant to the chemical vapor deposition chamber, wherein the flow rate of the oxidant ranges from 2.5 sccm to 25 sccm per square centimeter of the surface area of the anti-reflective layer under formation.

4. The method of claim 2 wherein forming an anti-reflective layer comprises introducing the inert gas to the chemical vapor deposition chamber, wherein the flow rate of the inert gas ranges 2.5 sccm to 25 sccm per square centimeter of the surface area of the anti-reflective layer under formation.

5. The method of claim 1 wherein forming an anti-reflective layer comprises forming a layer having anti-reflective properties over the first layer and forming a substantially hermetic layer over the layer having anti-reflective properties.

6. The method of claim 1 wherein forming an anti-reflective layer comprises forming a substantially hermetic layer over the first layer and forming a layer having anti-reflective properties over the substantially hermetic layer.

7. The method of claim 1, wherein forming an anti-reflective layer comprises forming a single anti-reflective layer.

8. The method of claim 1, wherein the anti-reflective layer comprises 2 to 20% hydrogen; 30 to 70% silicon; and 20 to 80% oxygen.

9. The method of claim 1, wherein the exposure to the atmosphere of a time period of at least 170 hours causes a decrease in stress of less than 10% of a tensile layer underlying the anti-reflective layer.

10. The method of claim 1, wherein the ratio of the helium gas flow rate to the carbon dioxide gas flow rate is from 1:1 to 2.5:1.

11. The method of claim 1, wherein the ratio of the helium gas flow rate to the carbon dioxide gas flow rate is from 1.5:1 to 2.5:1.

12. The method of claim 1, wherein forming an anti-reflective layer further comprises concurrently applying a high frequency radio frequency power and a low frequency radio frequency power in the in the chemical vapor deposition chamber.

13. The method of claim 12 wherein the power intensity of the applied low frequency radio frequency power is at least 0.12 W per square centimeter of the surface area of the anti-reflective layer under formation.

14. The method of claim 13 wherein the power intensity of the applied low frequency radio frequency power is between 0.12 and 1.0 W per square centimeter of the surface area of the anti-reflective layer under formation.

15. A method of fabricating an anti-reflective layer of a dual damascene device in a chemical vapor deposition chamber, the method comprising the steps of:
   forming a first layer of dielectric that is to be patterned;
   forming by chemical vapor deposition an anti-reflective layer over the first layer, wherein the anti-reflective layer is a moisture barrier and is nitrogen-free;
   wherein forming the anti-reflective layer comprises introducing a process gas mixture comprising carbon dioxide and helium to the chemical vapor deposition chamber, and wherein the ratio of the helium gas flow rate to the carbon dioxide gas flow rate is from about 1:1 to 5:1; and
   depositing a photoresist that contacts the anti-reflective layer.

16. The method of claim 15, wherein the ratio of the helium gas flow rate to the carbon dioxide gas flow rate is from 1:1 to 2.5:1.

17. The method of claim 15, wherein the ratio of the helium gas flow rate to the carbon dioxide gas flow rate is from 1.5:1 to 2.5:1.

18. A method of fabricating an anti-reflective layer of a dual damascene device in a chemical vapor deposition chamber, the method comprising the steps of:
   forming a first layer of dielectric that is to be patterned;
   exposing the first layer of dielectric to a process gas mixture comprising carbon dioxide and helium to thereby form by chemical vapor deposition an anti-reflective layer over the first layer, wherein the anti-reflective layer is a moisture barrier and/or is substantially hermetic and wherein the anti-reflective layer is nitrogen-free, comprises between about 20% and 80% oxygen, and has an extinction coefficient between about 0.1 and 1.3 at wavelengths of 248 nm and below and a refractive index between about 1.5 to about 3.0 at wavelengths of 248 nm and below;
   wherein the ratio of the helium gas flow rate to the carbon dioxide gas flow rate is from about 1:1 to 5:1; and
   depositing a photoresist that contacts the anti-reflective layer.

19. The method of claim 18 wherein forming the anti-reflective layer comprises concurrently applying a high frequency radio frequency power and a low frequency radio frequency power in the in the chemical vapor deposition chamber, wherein the power intensity of the applied low frequency radio frequency power is at least 0.12 W per square centimeter of the surface area of the anti-reflective layer under formation.

20. The method of claim 18 wherein the anti-reflective layer has a extinction coefficient between 0.1 and 1.2 at 248 nm and below.

21. The method of claim 18 wherein the anti-reflective layer has a refractive index of about 1.6 to about 2.2 at wavelengths of 248 nm and below.

* * * * *